US010971295B2

(12) United States Patent
Thomas et al.

(10) Patent No.: US 10,971,295 B2
(45) Date of Patent: Apr. 6, 2021

(54) TWO PART CLAMPING AND SUSPENSION MECHANISM FOR A SPLIT TOROIDAL CURRENT TRANSFORMER

(71) Applicant: Schweitzer Engineering Laboratories, Inc., Pullman, WA (US)

(72) Inventors: Mark A. Thomas, Pullman, WA (US); Eric Ryan, Spokane, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 260 days.

(21) Appl. No.: 16/207,593

(22) Filed: Dec. 3, 2018

(65) Prior Publication Data
US 2020/0176169 A1    Jun. 4, 2020

(51) Int. Cl.
| | |
|---|---|
| *G01R 15/18* | (2006.01) |
| *H01F 27/26* | (2006.01) |
| *H01F 38/20* | (2006.01) |
| *H01F 30/16* | (2006.01) |
| *H01F 27/28* | (2006.01) |
| *H01F 27/40* | (2006.01) |
| *H01F 41/02* | (2006.01) |
| *H01F 27/02* | (2006.01) |
| *G01R 31/08* | (2020.01) |

(52) U.S. Cl.
CPC .......... *H01F 27/26* (2013.01); *G01R 15/186* (2013.01); *H01F 27/02* (2013.01); *H01F 27/28* (2013.01); *H01F 27/402* (2013.01); *H01F 30/16* (2013.01); *H01F 38/20* (2013.01); *H01F 41/02* (2013.01); *G01R 31/085* (2013.01)

(58) Field of Classification Search
CPC .. G01R 15/142; G01R 15/183; G01R 15/186; G01R 31/085; H01F 27/02; H01F 27/06; H01F 27/24; H01F 27/26; H01F 27/28; H01F 27/40; H01F 27/263; H01F 27/402; H01F 30/16; H01F 38/20; H01F 38/30; H01F 41/02; H01F 41/06
See application file for complete search history.

(56) References Cited

U.S. PATENT DOCUMENTS

| | | | |
|---|---|---|---|
| 4,456,873 A | 6/1984 | Schweitzer | |
| 4,635,055 A | 1/1987 | Fernandes | |
| 5,426,360 A * | 6/1995 | Maraio | ................ G01R 15/142 324/126 |
| 5,483,215 A | 1/1996 | Mies | |

(Continued)

FOREIGN PATENT DOCUMENTS

WO    2015157296    10/2015

*Primary Examiner* — Minh N Tang
(74) *Attorney, Agent, or Firm* — Bradley W. Schield

(57) ABSTRACT

The present disclosure relates to ensuring contact between core halves of a current transformer. For example, a current transformer (CT) may include a split core comprising a first core half having a first plurality of faces and a second core half having a second plurality of faces. Each face of the first core half may contact a corresponding face of the second core half to allow magnetic flux to flow through the split core to induce current on windings of the CT. The CT may include a first housing that houses the first core half and a second housing that the second core half. The CT may include a biasing element that biases the second core half towards the first core half to ensure that each face of the second core half contacts the corresponding face of the first core half.

19 Claims, 6 Drawing Sheets

(56) References Cited

U.S. PATENT DOCUMENTS

| | | |
|---|---|---|
| 5,550,476 A | 8/1996 | Lau |
| 5,565,783 A | 10/1996 | Lau |
| 5,656,931 A | 8/1997 | Lau |
| 5,729,125 A | 3/1998 | Schweitzer |
| 5,889,399 A | 3/1999 | Schweitzer |
| 5,990,674 A | 11/1999 | Schweitzer |
| 6,002,260 A | 12/1999 | Lau |
| 7,227,441 B2 | 6/2007 | Skendzic |
| 7,312,686 B2 * | 12/2007 | Bruno .................. H01F 27/263 336/229 |
| 7,450,000 B2 | 11/2008 | Gidge |
| 7,474,192 B2 | 1/2009 | Skendzic |
| 7,626,794 B2 | 12/2009 | Swartzendruber |
| 7,795,994 B2 | 11/2010 | Radtke |
| 7,930,141 B2 | 4/2011 | Banting |
| 8,536,857 B2 * | 9/2013 | Nero, Jr. ............ G01R 19/0092 324/119 |
| 8,738,318 B2 | 5/2014 | Spillane |
| 9,182,429 B2 | 11/2015 | Saxby |
| 9,229,036 B2 | 1/2016 | Kast |
| 9,424,975 B2 * | 8/2016 | Cook ...................... H01F 27/06 |
| 9,448,257 B2 | 9/2016 | Saxby |
| 9,915,680 B2 | 3/2018 | Khoshnood |
| 9,954,354 B2 | 4/2018 | Baker |
| 9,984,818 B2 | 5/2018 | Rumrill |
| 2006/0279910 A1 | 12/2006 | Gunn |
| 2008/0077336 A1 | 3/2008 | Fernandes |
| 2009/0309754 A1 | 12/2009 | Bou |
| 2010/0084920 A1 * | 4/2010 | Banting ................. H02J 50/10 307/66 |
| 2010/0085036 A1 | 4/2010 | Banting |

* cited by examiner

TWO PART CLAMPING AND SUSPENSION MECHANISM FOR A SPLIT TOROIDAL CURRENT TRANSFORMER

TECHNICAL FIELD

The present disclosure relates generally to current transformers and, more particularly, to ensuring sufficient contact between halves of a split core current transformer

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
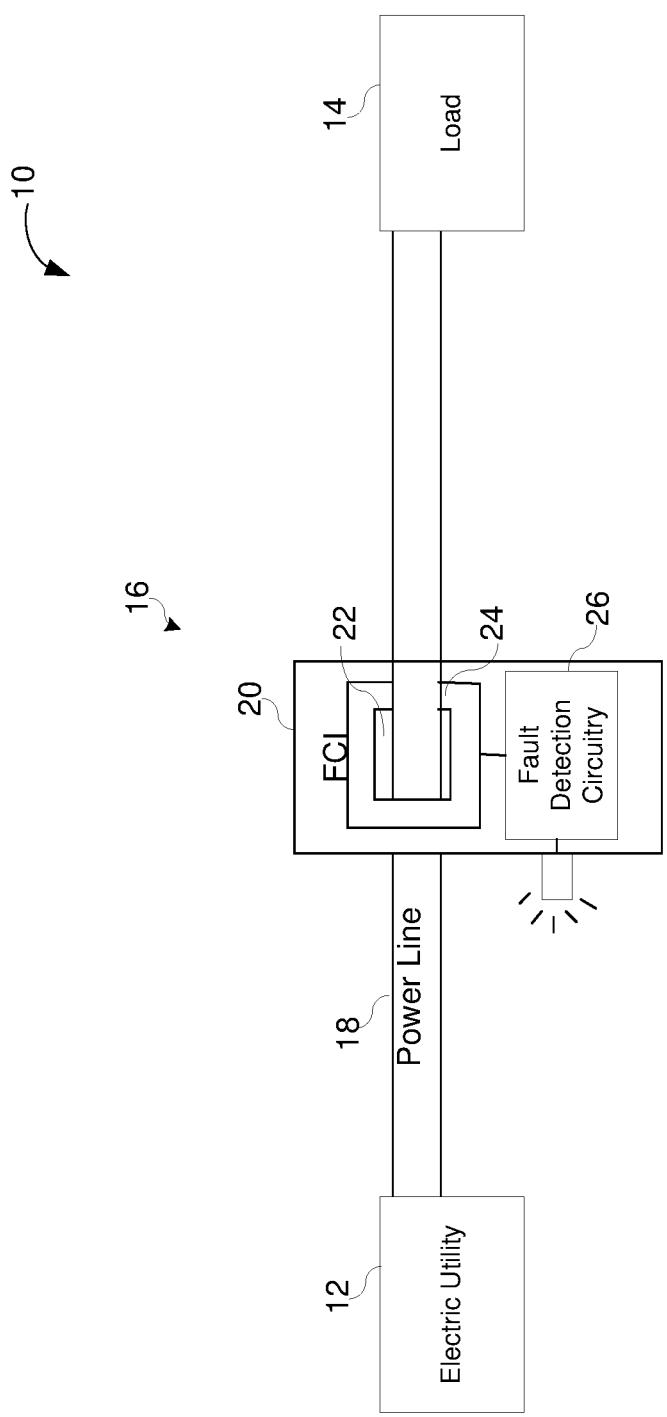
FIG. 1 illustrates a block diagram of an electric power delivery system having a faulted circuit indicator (FCI) that uses a current transformer (CT) to measure current and/or to harvest power from a power line, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems are used to distribute electric power from electric power generation sources to loads, which may be close or distant from the generation sources. Such systems may include generators or other sources, transformers step up or down voltages, transmission lines, buses, distribution lines, voltage regulators, capacitor banks, reactors, circuit breakers, switches, and other such equipment. Electric power delivery equipment may be monitored, automated and/or protected using intelligent electronic devices (IEDs).

IEDs, such as faulted circuit indicators (FCIs), may use current transformers (CTs) to detect current and/or harvest power from conductors, such as power lines, of the electric power delivery system. The CT may include windings and a magnetic core. The current on the conductor may create a magnetic field in the core that induces current in the windings. The current induced in the windings may be proportional to the current on the conductor. IEDs may better monitor and control operation of the power delivery system by using CTs to monitor the current on various conductors in electric power distribution systems. Further, the IED may operate by using power harvesting by the CT.

To couple the CT to a conductor, the core may be split into two portions, or halves. The first core half may be contained in a first housing and the second core half may be contained in a second housing. In some embodiments, the housings may be made of plastic and protect the electric and magnetic components of the CT. The first housing and the second housing may be rotatably coupled and biased towards a closed position. The first housing and the second housing may be rotated to an open position to allow the CT to be installed. The CT may be placed around a conductor and rotated to a closed position to secure the CT to the conductor.

However, the CT may not operate effectively if there is insufficient contact area between the faces of each half of the core when in the closed position. For example, the core halves may be misaligned or inadequately contact one another due to installation or manufacturing tolerances. Accordingly, there is a need to ensure sufficient contact between the core halves of a CT.

As described below, the CT may include a biasing element, such as a compression spring, that biases the second core half towards a contact position with the first core half to ensure adequate contact between the faces of the first and second core halves. For example, the biasing element may movably couple the second housing to an overmold of the second core half. The overmold may encase the core half to provide mounting and/or guide features for the biasing element. The biasing element may allow the second core half to extend from the second housing towards contacting the first core half. For instance, a compression spring may be in a compressed state between the overmold of the second core half and the second housing to exert a force onto the second core half in the direction of the first core half to ensure adequate contact between the faces of the first and second core halves.

FIG. 1 is a block diagram of a power system 10 having a source such as, for example, an electric utility 12 that generates power to deliver electrical energy to a load 14 via a transmission and distribution system 16. The transmission and distribution system 16 may include one or more conductors, such as an overhead power line 18. The power line 18 may be any suitable transmission and/or distribution power line. The power system 10 may include a faulted circuit indicator (FCI) 20 having a current transformer (CT) 24 that encloses a portion of power line 18 via an opening 22 and secures the FCI 20 to the portion of the power line 18. The FCI 20 may include fault detection circuitry 26 that receives a signal from the CT 24 and monitors the power line 18 for events. The fault detection circuitry 26 may provide a signal indicating the occurrence of an event. For example, the CT 24 may provide a current signal to the fault detection circuitry 26 indicating of the current on the power line 18. The fault detection circuitry 26 may detect an event, such as an overcurrent event or an undercurrent event, on the power line 18 and provide an indication (e.g., via a light emitting diode (LED), via a transceiver, etc.) of the event to allow operators to locate and assess the cause of the event.

Figure 2:
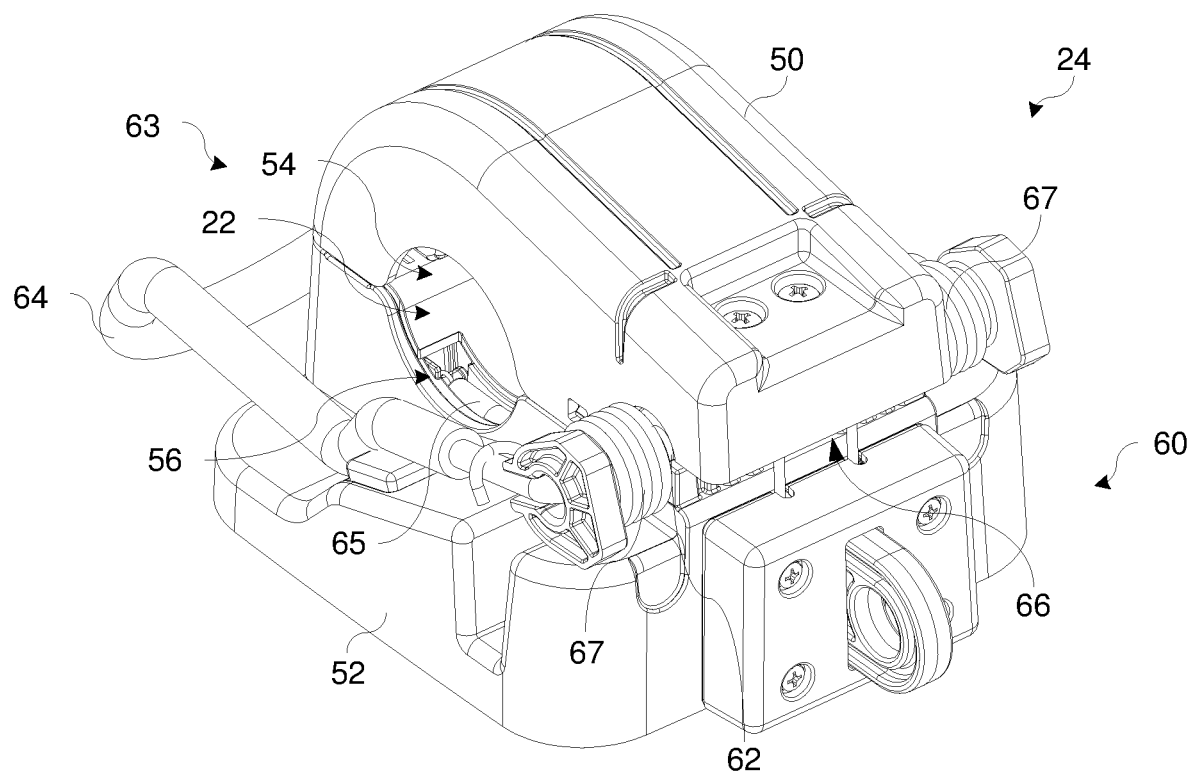
FIG. 2 illustrates a perspective view of the CT of FIG. 1, in accordance with an embodiment.

FIG. 2 is a perspective view of an embodiment of a CT 24 that may be used in the FCI 20. In the illustrated embodiment, the CT 24 includes a first housing 50 and a second housing 52. While in the closed position, as shown in FIG.

2, the first housing 50 and the second housing 52 form an annulus having an opening 22 therebetween to enclose a portion of the power line 18. That is, the first housing 50 includes a first portion 54 (e.g., first semi-cylindrical opening) of the opening 22 and the second housing 52 includes a second portion 56 (e.g., second semi-cylindrical opening) of the opening 22. The first portion 54 and the second portion 56 are contoured to form the opening 22 (e.g., cylindrical opening) to receive a conductor, such as the power line 18. The first housing 50 and the second housing 52 may be rotationally coupled to each other on a first end 60 of the FCI 20 via a hinged connection 62. In other embodiments, the first housing 50 and the second housing 52 may be linearly coupled or coupled in any other suitable manner. The hinged connection 62 may align a second end 63 of the first housing to the second end 63 of the second housing 52 to position the windings annularly and proximate to the power line 18.

In the illustrated embodiment, the FCI 20 includes a clamp bar 64 that guides the power line 18 as the power line 18 is inserted into the opening 22 when in the open position. The FCI 20 has a torsion spring 66 that biases the first housing 50 and the second housing 52 towards each other in the closed position. That is, forces from the torsion spring 66 may maintain the first housing 50 and the second housing 52 in the closed position. To install the CT 24 to the power line 18, the CT 24 may be propped open with a prop 65. The prop may then be removed to close the CT 24 in the closed position once the CT 24 is properly placed. Further, a clamp spring 67 may bias the clamp bar 64 to the closed position. While the clamp bar 64 and the clamp spring 67 are used in the illustrated embodiment, note that any suitable method of opening and closing the FCI 20 around the power line 18 may be used.

Figure 3:
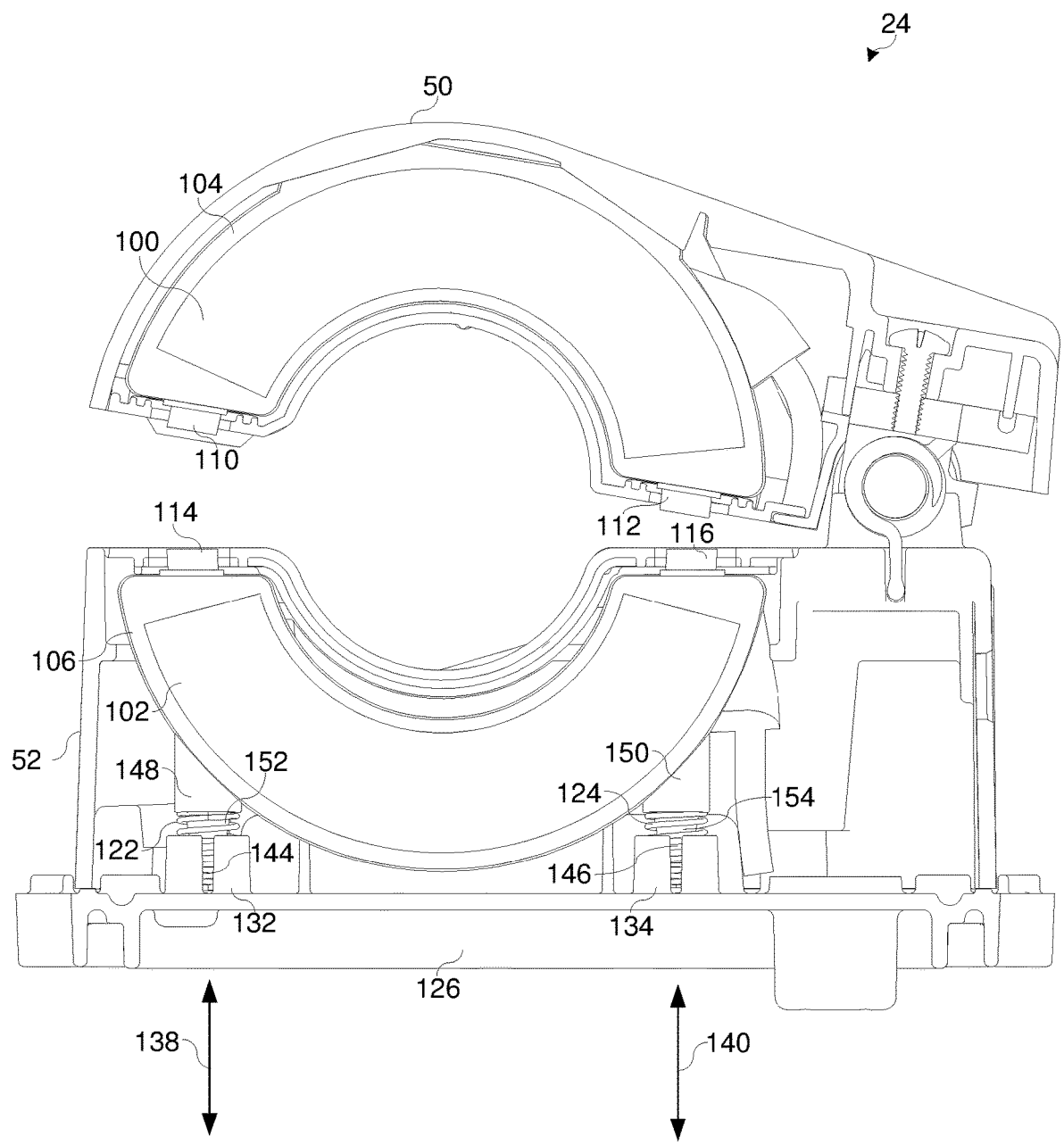
FIG. 3 illustrates a cross-sectional side view of the CT of FIG. 1 in an open position, in accordance with an embodiment.

FIG. 3 is a cross-sectional side view of the CT 24 in an open position, in accordance with an embodiment. As mentioned above, the CT 24 may include coiled windings around halves of a split core made of, for example, ferromagnetic material. The CT 24 includes the first housing 50 that houses a first core half 100 and the second housing 52 that houses a second core half 102. The CT 24 may include windings wrapped around each of the core halves 100 and 102. The windings may be electrically connected to the fault detection circuitry 26 to enable the fault detection circuitry 26 to measure the current on the power line 18. That is, the current through the power line 18 may create a magnetic flux in the split core with a varying magnetic field that induces current on the windings proportional to the current through the power line 18.

In the illustrated embodiment, the first core half 100 and the second core half 102 may be enclosed in a first overmold 104 and a second overmold 106, respectively, to secure the windings around the core halves 100 and 102. The first overmold 104 of the first core half 100 may be inserted into the first housing 50, and the second overmold 106 of the second core half 102 may be may be inserted into the second housing 52. The first core half 100 may have faces 110 and 112 that extend from the first overmold 104 to contact respective faces 114 and 116 of the second core half 102. The faces 110 and 112 of the first core half 100 and the faces 114 and 116 of the second core half 102 contact each other to allow for magnetic flux to pass throughout the split core to cause the current on the windings.

However, if the faces 110 or 112 of the first core half 100 do not have sufficient contact area with the faces 114 or 116 of the second core half 102 to allow the magnetic flux to pass throughout the split core, then the CT 24 may not operate effectively. That is, the flow of magnetic flux passing throughout the core may be limited due to insufficient contact of the face 110 with the face 114 and/or the face 112 with the face 116. Due to the limited magnetic flux induced in the magnetic core, the magnetic core may induce limited or no current in the CT 24. Because of the limited or no current in the CT, the CT 24 may not enable current sensing and/or power harvesting capabilities of the FCI 20.

The CT 24 may include biasing elements 122 and 124, such as compression springs, that biases the second core half 102 into a contact position with the first core half 100. That is, the biasing elements 122 and 124 may ensure that the faces 110 and 112 of the first core half 100 sufficiently contact the faces 114 and 116 of the second core half 102, respectively, to allow the magnetic flux to pass throughout the core. Further, the biasing elements 122 and 124 may bias the faces 114 and 116 of the second core half 102 to be against and parallel with the faces 110 and 112 of the first core half 100 to correct for angular tolerances between the core halves due to the installation and/or manufacturing processes.

In the illustrated embodiment, the second housing 52 includes a midplane 126 between the CT 24 and the fault detection circuitry 26. The midplane 126 may be part of an enclosure of the fault detection circuitry 26 that protects the fault detection circuitry 26 from environmental factors, such as rain. The midplane 126 may include annular bodies 132 and 134 that receive the biasing elements 122 and 124 to maintain the lateral position of the biasing elements 122 and 124 with respect to the midplane 126 while enabling the biasing elements 122 and 124 to compress and expand in an axial direction 138 and 140 from the annular body 132 and 134, orthogonal to the midplane 126. Further, each annular body 132 and 134 may include a drain opening 144 and 146, respectively, to allow water to drain from the annular bodies 132 and 134.

The second overmold 106 of the second core half 102 may include protrusions 148 and 150 that engage the biasing elements 122 and 124, respectively to secure the biasing elements 122 and 124 to the second overmold 106. The protrusions 148 and 150 may each include a boss 152 and 154, respectively, that engages an axial opening of the biasing member 122 and 124 to secure the second overmold 106 to the biasing elements 122 and 124.

The biasing elements 122 and 124 may provide an upward force to secure the faces 114 and 116 of the second core half 102 to the respective faces 110 and 112 of the first core half 100 to allow the CT 24 to perform current sensing and power harvesting operations on the conductor 18. Moreover, the biasing elements 122 and 124 may form an isolating interface between the midplane 126 and the second core half 102 to adjust for angular tolerances and to ensure that the faces 114 and 116 are parallel to the faces 110 and 112, respectively. Further, due to the annular bodies 132 and 134 limiting the lateral movement of the biasing members 122 and 124, the bosses 152 and 154 may limit the lateral movement of the second core half 102 with respect to the second housing 52.

Figure 4:
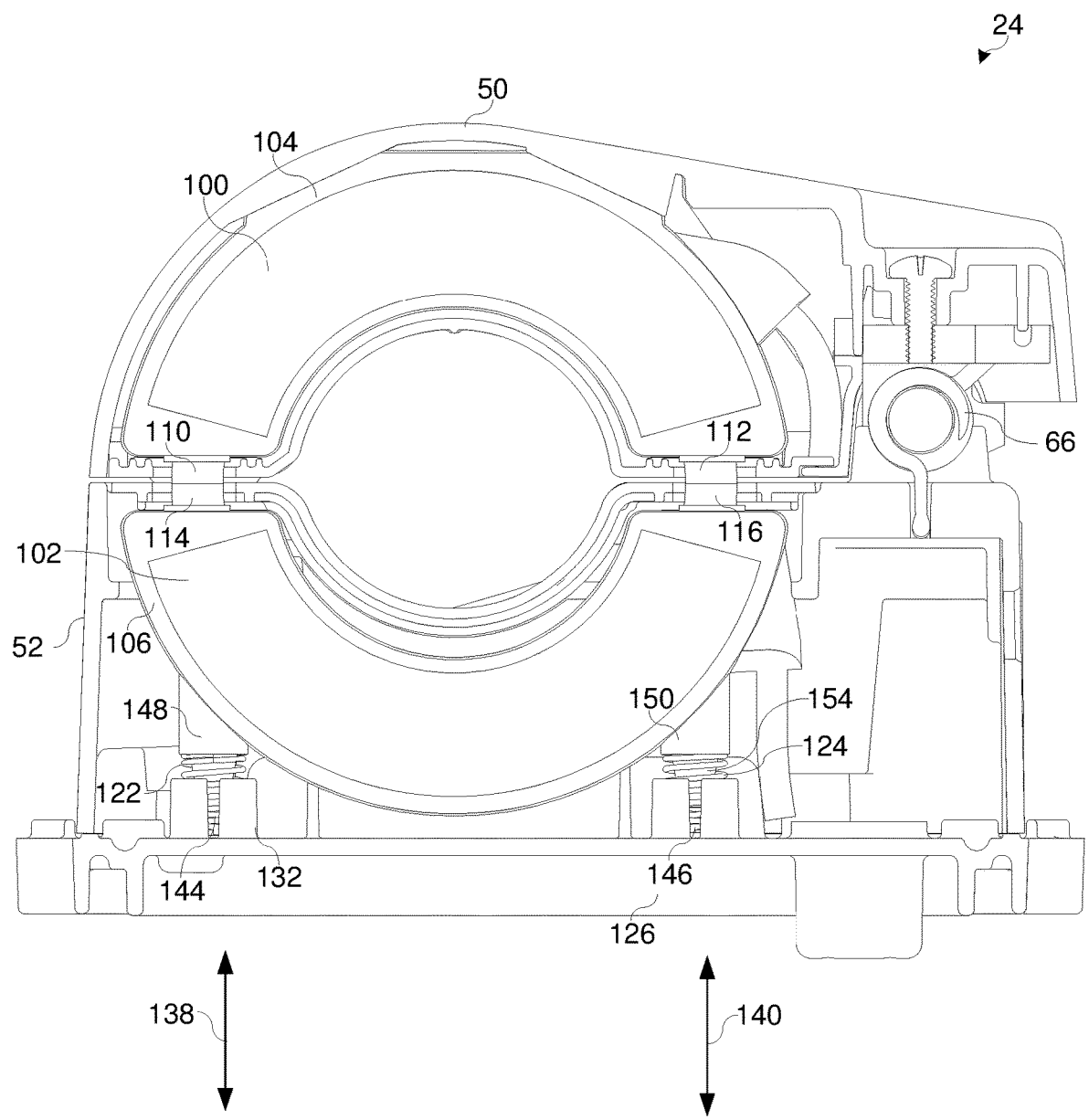
FIG. 4 illustrates a cross-sectional side view of the CT of FIG. 1 in a closed position, in accordance with an embodiment.

FIG. 4 illustrates is a cross-sectional side view of the CT 24 in a closed position, in accordance with an embodiment. In the closed position, the biasing elements 122 and 124 are in a compressed state. The stored energy in the compressed states exert a force on the faces 114 and 116 of the second core half 102 towards a contact position with the respective faces 110 and 112 of the first core half 100. By securing the faces together, the second core half 102 of the CT 24 may have sufficient contact to allow magnetic flux to flow across the core faces to allow the CT 24 to sense current and to harvest power from the conductor 18. For example, if the manufacturing of the CT 24 were to cause a gap in between the first core half 100 and the second core half 102 when in the closed position, the biasing element 122 and 124 may exert a force on the protrusions 148 and 150, respectively, to cause the faces 114 and 116 to contact the faces 110 and 116 sufficiently to sense current and/or to harvest power to operate the FCI 20.

Figure 5:
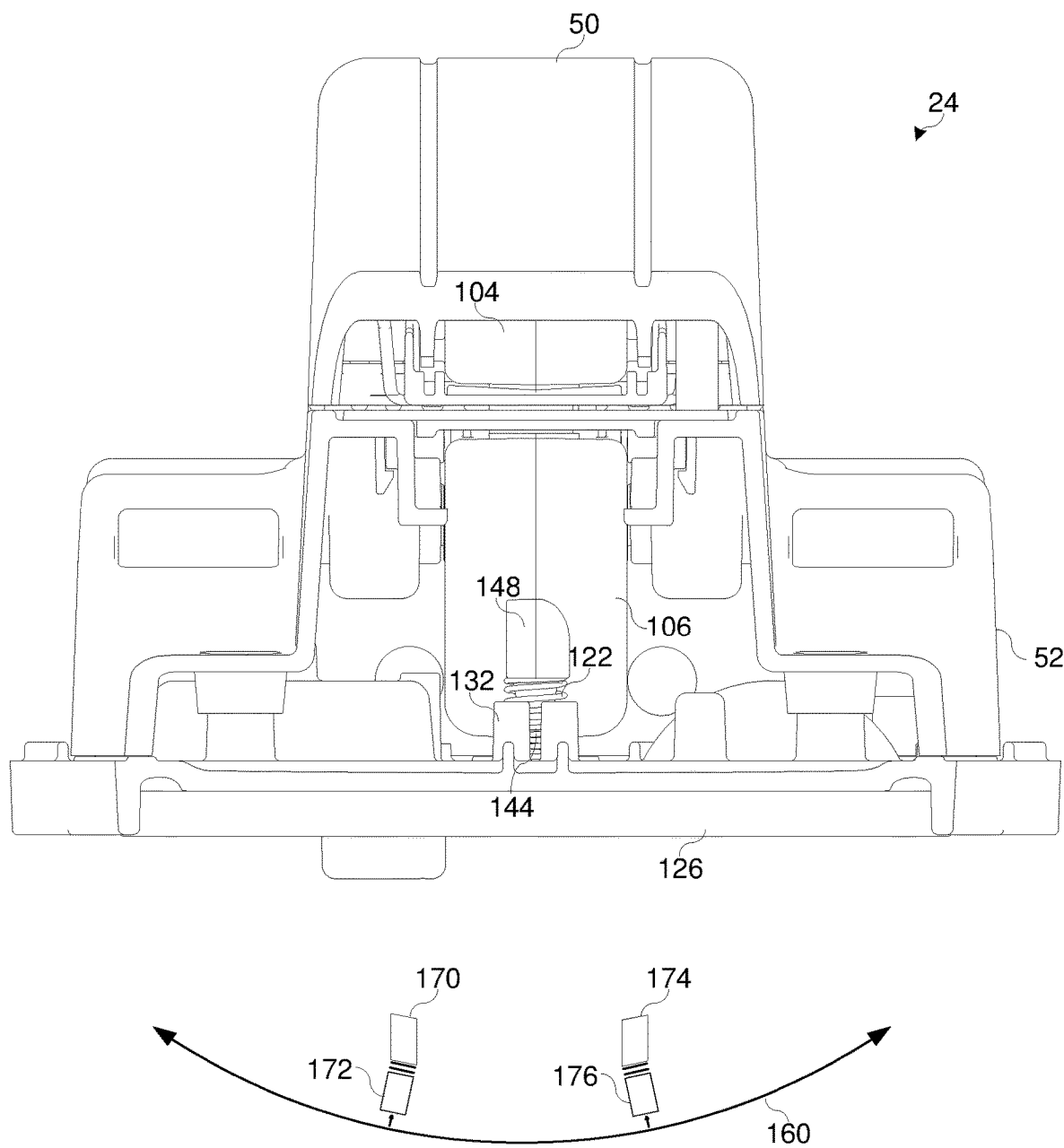
FIG. 5 illustrates a cross-sectional front view of the CT of FIG. 1, in accordance with an embodiment.

FIG. 5 illustrates a front cross-sectional view of the CT 24 in accordance with an embodiment. The biasing elements 122 and 124 may account for angular tolerances from side-to-side 160. For example, if faces 110 and 112 of the first core half 100 were tilted, as indicated with reference 170, with respect to the second housing 52, the biasing elements 122 and 124 may apply a force at an angle that compensates for the tilt to maintain the faces, as indicated with reference 172, of the second core half 102 to be parallel to the faces 110 and 112 of the first core half 100. Likewise, if faces 110 and 112 of the first core half 100, as indicated with reference 174, are tilted in the opposite direction with respect to the second housing 52, the biasing elements 122 and 124 may apply a force at an angle that compensates for the tilt to maintain the faces, as indicated with reference 176, parallel to each other.

Figure 6:
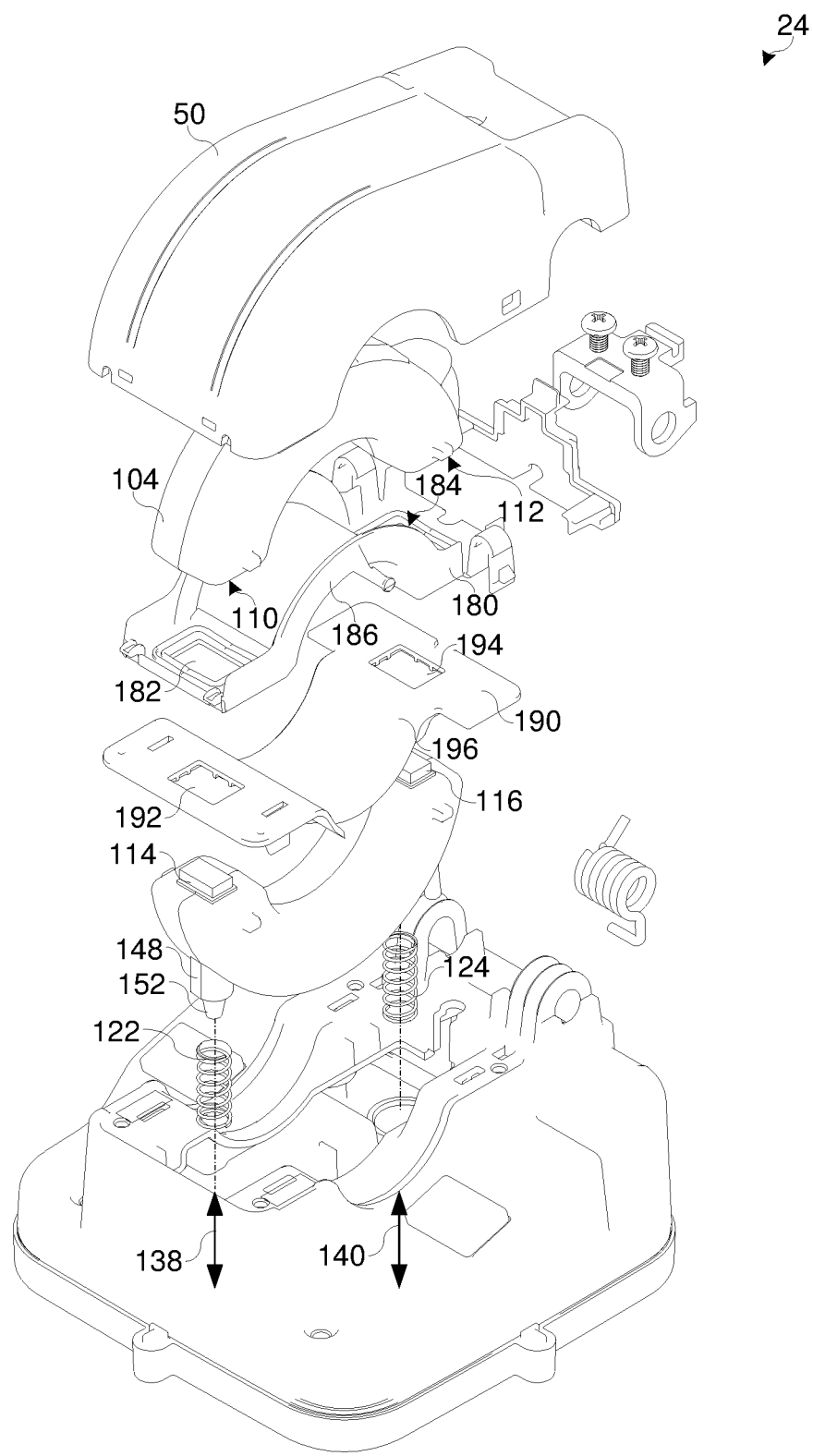
FIG. 6 illustrates an exploded perspective view of the CT of FIG. 1, in accordance with an embodiment.

FIG. 6 illustrates an exploded perspective view of the CT 24, in accordance with an embodiment. The CT 24 includes a first saddle 180 that secures the first overmold 104 of the first core half 100 within the first housing 50. The first saddle 180 may include openings 182 and 184 that enable the faces 110 and 112 of the first core half 100 to protrude from the first housing 50. The first saddle 180 may have a contoured body 186 to match the contour of the first overmold 104 to prevent movement of the first core half 100 within the first housing 50. For example, the contoured body 186 may form a semicircle that matches a semicircle of the first overmold 104.

In the illustrated embodiment, the CT 24 includes a second saddle 190 that secures the second overmold 106 of the second core half 102 within the second housing 50. Similarly, the second saddle 190 may include openings 192 and 194 that enable the respective faces 114 and 116 to protrude from the second housing 52. Further, the second saddle 190 may have a contoured body 196 that matches the contour of the second overmold 106 to secure the second core half 102 within the second housing 52 while allowing for movement in an axial direction 138 and 140 of the second core half 102 from the biasing elements 122 and 124. For instance, the contoured body 196 may form a semicircle that matches a semicircle of the second overmold 106.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A current transformer (CT), comprising:
    a split core comprising a first core half having a first plurality of faces and a second core half having a second plurality of faces, wherein each face of the first core half is configured to contact a corresponding face of the second core half to allow magnetic flux to flow through the split core to induce current on windings of the CT;
    a first housing configured to house the first core half;
    a second housing rotatably coupled to the first housing and configured to house the second core half, wherein the first housing and the second housing, when rotated to an open position, form an opening to allow a conductor to be inserted between the first core half and the second core half, and when rotated to a closed position, close the opening between the first core half and the second core half to form an annulus around the conductor;
    a biasing element configured to bias the second core half towards the first core half to ensure that each face of the second core half contacts the corresponding face of the first core half, wherein the biasing element is configured to position each face of the first plurality of faces to be parallel to the corresponding face of the second plurality of faces to account for differences in surfaces between the first plurality of faces and the second plurality of faces
    a first overmold configured to secure windings of the CT to the first core half; and
    a second overmold configured to secure windings of the CT to the second core half, wherein the second overmold comprises a protrusion to support the second overmold on the biasing element and a boss configured to engage an axial opening of the biasing element to stabilize the overmold on the biasing element.

2. The CT of claim 1, wherein the second housing comprises an annular body configured to receive the biasing element within the annular body to maintain the lateral position of the biasing element with respect to the second housing while enabling the biasing element to compress and expand axially with respect to the annular body.

3. The CT of claim 1, wherein the biasing element comprises a compression spring positioned in the second housing, wherein the compression spring is configured to apply an expanding force from the second housing to the second core half in a direction towards the first core half to ensure that each face of the second core half contacts the corresponding face of the first core half.

4. The CT of claim 3, wherein the compression spring is configured to be at least partially compressed when the CT is in the closed position to maintain contact between the second core half and the first core half.

5. The CT of claim 1, wherein the first housing comprises a first saddle configured to secure a first overmold of the first core half within the first housing.

6. The CT of claim 5, wherein the first saddle comprises openings configured to receive corresponding faces of the first core half to allow each face of the first core half to contact the corresponding face of the second core half.

7. The CT of claim 1, wherein the second housing comprises a second saddle configured to secure a second overmold of the second core half within the second housing.

8. The CT of claim 7, wherein the second saddle comprises openings configured to receive corresponding faces of the second core half to allow each face of the second core half to contact the corresponding face of the first core half.

9. A faulted circuit indicator (FCI), comprising:
a current transformer (CT), comprising:
an annular split core having a first core half with a first plurality of faces and a second core half with a second plurality of faces, wherein each face of the first core half is configured to contact a corresponding face of the second core half to allow magnetic flux to flow through the annular split core to induce current on windings of the CT;
a first housing configured to house the first core half;
a second housing rotationally coupled to the first housing, wherein the second housing is configured to house the second core half;
wherein the first housing and the second housing, when rotated to an open position, form an opening to allow a conductor of an electric power system to be inserted between the first core half and the second core half, and when rotated to a closed position, close the opening between the first core half and the second core half to form an annulus around the conductor; and
a biasing element configured to bias the second core half towards the first core half to ensure that each face of the second core half contacts the corresponding face of the first core half, wherein the biasing element is configured to position each face of the first core half to be parallel to the corresponding face of the second core half to account for differences in surfaces between the first core half and the second core half;
a first overmold configured to secure windings of the CT to the first core half; and
a second overmold configured to secure windings of the CT to the second core half, wherein the second overmold comprises a protrusion to support the second overmold on the biasing element and a boss configured to engage an axial opening of the biasing element to stabilize the overmold on the biasing element;
detection circuitry configured to:
receive a signal from the current transformer indicating current on the conductor; and
detect an event on the electric power system based on the current on the conductor.

10. The FCI of claim 9, wherein the biasing element comprises a compression spring.

11. The FCI of claim 9, wherein the biasing element is configured to flexibly exert a force on the second core half towards a contact position with the first core half such that the biasing element causes sufficient contact between the first core half and the second core half to induce current on the windings.

12. The FCI of claim 9, wherein the second housing comprises a midplane that separates the CT from the detection circuitry, wherein the biasing element is positioned orthogonal to the midplane.

13. The FCI of claim 9, wherein the first housing comprises a first saddle configured to secure a first overmold of the first core half within the first housing.

14. The FCI of claim 13, wherein the first saddle comprises openings configured to receive corresponding faces of the first core half to allow each face of the first core half to contact the corresponding face of the second core half.

15. The FCI of claim 9, wherein the second housing comprises a second saddle configured to secure a second overmold of the second core half within the second housing.

16. The FCI of claim 15, wherein the second saddle comprises openings configured to receive the faces of the second core half to contact the faces of the first core half.

17. A method, comprising:
covering a first core half of a current transformer (CT) with a first overmold;
covering a second core half of the CT with a second overmold;
inserting the first overmold into a first housing of the CT;
inserting the second overmold into a second housing;
inserting at least one biasing element into the second housing;
movably coupling the second overmold to the at least one biasing element to bias the second core half towards the first core half to ensure that faces of the second core half contact corresponding faces of the first core half, wherein the second overmold comprises a protrusion to support the second overmold on the biasing element and a boss configured to engage an axial opening of the biasing element to stabilize the second overmold on the biasing element.

18. The method of claim 17, comprising securing the second overmold of the CT to the second housing via a saddle having openings to allow faces of the second core half to protrude from the second housing.

19. The method of claim 17, comprising coupling the CT to a faulted circuit indicator (FCI) to enable the FCI to detect current on a conductor of a power delivery system.

* * * * *